United States Patent
Goto

(10) Patent No.: US 10,677,850 B2
(45) Date of Patent: Jun. 9, 2020

(54) STATE OF CHARGE ESTIMATION METHOD AND STATE OF CHARGE ESTIMATION APPARATUS

(71) Applicant: TOYOTA JIDOSHA KABUSHIKI KAISHA, Toyota-shi, Aichi-ken (JP)

(72) Inventor: Satoshi Goto, Nagakute (JP)

(73) Assignee: TOYOTA JIDOSHA KABUSHIKI KAISHA, Toyota-shi, Aichi-ken (JP)

(*) Notice: Subject to any disclaimer, the term of this patent is extended or adjusted under 35 U.S.C. 154(b) by 168 days.

(21) Appl. No.: 15/510,049

(22) PCT Filed: Aug. 27, 2015

(86) PCT No.: PCT/IB2015/001445
§ 371 (c)(1),
(2) Date: Mar. 9, 2017

(87) PCT Pub. No.: WO2016/038436
PCT Pub. Date: Mar. 17, 2016

(65) Prior Publication Data
US 2017/0261560 A1    Sep. 14, 2017

(30) Foreign Application Priority Data
Sep. 10, 2014    (JP) .................. 2014-183927

(51) Int. Cl.
*G01R 31/382*    (2019.01)
*G01R 31/388*    (2019.01)
(Continued)

(52) U.S. Cl.
CPC ....... *G01R 31/382* (2019.01); *G01R 31/3648* (2013.01); *G01R 31/388* (2019.01); *H01M 10/486* (2013.01)

(58) Field of Classification Search
CPC ............ G01R 31/3606; G01R 31/3648; G01R 31/3637; H01M 10/486
See application file for complete search history.

(56) References Cited

U.S. PATENT DOCUMENTS 5,955,869 A * 9/1999 Rathmann .......... G01R 31/3648
320/132
2005/0269993 A1* 12/2005 Palanisamy ........ G01R 31/3634
320/149

(Continued)

FOREIGN PATENT DOCUMENTS

| JP | 2012-145403 A | 8/2012 |
| JP | 2012-173048 A | 9/2012 |
| JP | 2013-134962 A | 7/2013 |

*Primary Examiner* — Akm Zakaria
(74) *Attorney, Agent, or Firm* — Sughrue Mion, PLLC

(57) ABSTRACT

A state of charge estimation method includes: measuring a voltage of a lithium ion secondary battery that is being charged at a predetermined current rate higher than or equal to a predetermined charging rate; obtaining a rate of increase in the measured voltage; and estimating a state of charge of the lithium ion secondary battery based on the rate of increase in the measured voltage and first reference data. The first reference data are data including a correlation between a state of charge of a reference lithium ion secondary battery and a rate of increase in voltage of the reference lithium ion secondary battery when the reference lithium ion secondary battery is charged at the predetermined current rate.

16 Claims, 9 Drawing Sheets

(51) Int. Cl.
*G01R 31/36* (2020.01)
*H01M 10/48* (2006.01)

(56) References Cited

U.S. PATENT DOCUMENTS

| | | | | |
|---|---|---|---|---|
| 2011/0309798 | A1* | 12/2011 | Hara | H01M 4/131 |
| | | | | 320/134 |
| 2012/0158330 | A1* | 6/2012 | Araki | G01R 31/3679 |
| | | | | 702/63 |
| 2012/0176092 | A1 | 7/2012 | Fujii et al. | |
| 2013/0002194 | A1* | 1/2013 | Sasaki | H01M 10/425 |
| | | | | 320/107 |
| 2013/0052535 | A1* | 2/2013 | Yanagihara | H01M 4/485 |
| | | | | 429/220 |
| 2013/0314050 | A1* | 11/2013 | Matsubara | H02J 7/00 |
| | | | | 320/134 |
| 2014/0111145 | A1* | 4/2014 | Mitsuda | B60L 11/14 |
| | | | | 320/107 |
| 2014/0113191 | A1* | 4/2014 | Nakamura | C01B 25/45 |
| | | | | 429/220 |
| 2014/0117940 | A1* | 5/2014 | Takahata | H01M 4/13 |
| | | | | 320/134 |
| 2016/0087280 | A1* | 3/2016 | Toyama | H01M 4/661 |
| | | | | 429/245 |

* cited by examiner

F I G . 3
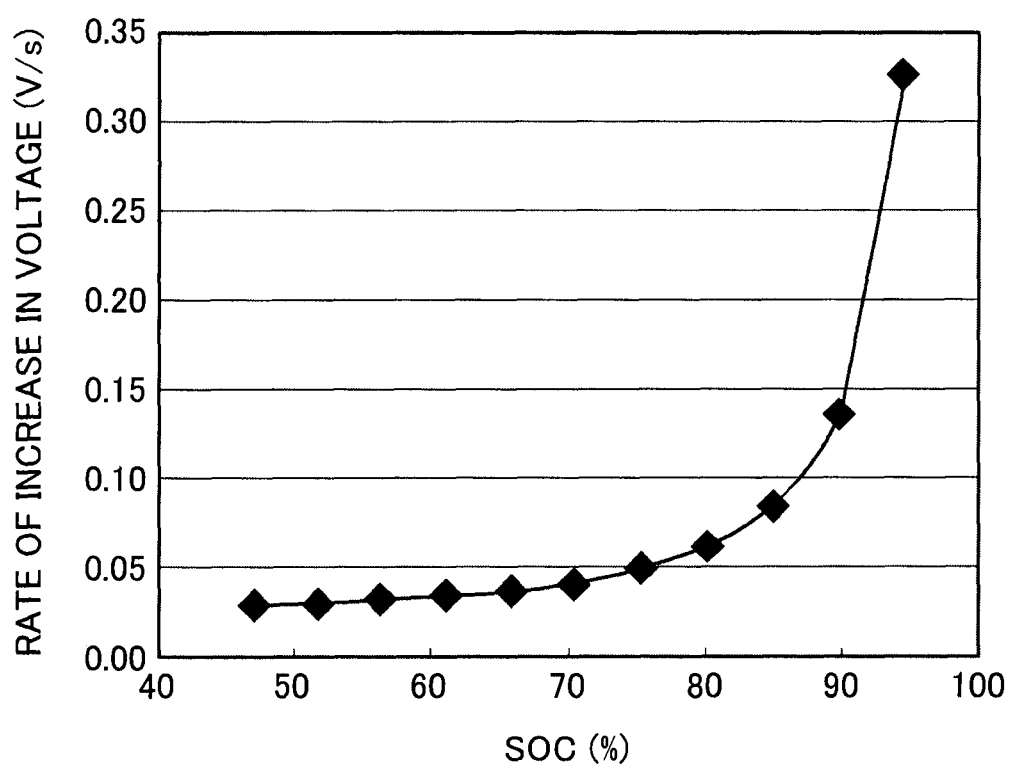

STATE OF CHARGE ESTIMATION METHOD AND STATE OF CHARGE ESTIMATION APPARATUS

CROSS REFERENCE TO RELATED APPLICATIONS

This application is a National Stage of International Application No. PCT/IB2015/001445 filed Aug. 27, 2015, claiming priority based on Japanese Patent Application No. 2014-183927 filed Sep. 10, 2014, the contents of all of which are incorporated herein by reference in their entirety.

BACKGROUND OF THE INVENTION

1. Field of the Invention

The invention relates to a state of charge estimation method and a state of charge estimation apparatus. In the specification, the term "secondary battery" means a general repeatedly rechargeable battery. The term "lithium ion secondary battery" means a secondary battery in which lithium ions are utilized as, electrolyte ions and charging or discharging is achieved as a result of migration of electric charge together with lithium ions between a positive electrode and a negative electrode.

2. Description of Related Art

Japanese Patent Application Publication No. 2013-134962 (JP 2013-134962 A) describes a method of detecting the state of charge (SOC) of a lithium ion secondary battery. The SOC may be regarded as the remaining capacity of the lithium ion secondary battery. JP 2013-134962 A describes a method of detecting the SOC of a lithium ion secondary battery including a positive electrode active material in which part of a NiMn spinel is replaced with Ti. The positive electrode active material is expressed by the general formula $LiNi_{0.5}Mn_{1.5-x}Ti_xO_4$ ($0.05 \leq X \leq 0.1$). JP 2013-134962 A describes a method of detecting the SOC of a lithium ion secondary battery that uses the positive electrode active material expressed by the above-described general formula by focusing on the point that a stepwise SOC map is obtained. The stepwise map has a plurality of sections in each of which a voltage is constant for an SOC. In JP 2013-134962 A, the SOC of the lithium ion secondary battery is detected from a detected voltage by consulting the SOC map.

When the SOC of the lithium ion secondary battery is high, the amount of change in open circuit voltage (OCV) for the amount of change in SOC may exhibit a decreasing tendency. The correlation between the OCV and the SOC may be referred to as an OCV-SOC characteristic. In such a lithium ion secondary battery, it is difficult to estimate the SOC from the open circuit voltage (OCV).

SUMMARY OF THE INVENTION

The invention provides a state of charge estimation method and a state of charge estimation apparatus.

A state of charge estimation method according to a first aspect of the invention includes: measuring a voltage of a lithium ion secondary battery that is being charged at a predetermined current rate higher than or equal to a predetermined charging rate; obtaining a rate of increase in the measured voltage; and estimating a state of charge of the lithium ion secondary battery based on the rate of increase in the measured voltage and first reference data. The first reference data are data including a correlation between a state of charge of a reference lithium ion secondary battery and a rate of increase in voltage of the reference lithium ion secondary battery when the reference lithium ion secondary battery is charged at the predetermined current rate.

In the first aspect of the invention, the predetermined current rate may be a current rate higher than or equal to 20 C.

In the first aspect of the invention, the first reference data may include pieces of reference data respectively corresponding to mutually different current rates higher than or equal to the predetermined charging rate.

In the first aspect of the invention, the first reference data may include pieces of reference data respectively corresponding to mutually different temperatures of the reference lithium ion secondary battery.

In the first aspect of the invention, the state of charge of the lithium ion secondary battery may be estimated based on the first reference data and the rate of increase in voltage of the lithium ion secondary battery after a predetermined time from a start of charging the lithium ion secondary battery.

In the first aspect of the invention, the predetermined time may correspond to a time that is taken until the rate of increase decreases to a predetermined value or lower.

In the above configuration, the predetermined time may correspond to a time that is taken until an electric charge migration reaction completes on a surface of each positive electrode active material particle in the lithium ion secondary battery.

In the above configuration, the predetermined time may be longer than or equal to 0.01 seconds and shorter than or equal to 0.2 seconds from the start of charging.

In the first aspect of the invention, a positive electrode active material of the lithium ion secondary battery may be formed of active material particles each having a spinel structure or an olivine structure.

In the first aspect of the invention, the lithium ion secondary battery of which the state of charge is estimated may have a configuration equal to a configuration of the reference lithium ion secondary battery.

In the first aspect of the invention, a previously acquired state of charge of the lithium ion secondary battery may be corrected based on a reference state of charge in the first reference data, the reference state of charge corresponding to the rate of increase in the measured voltage.

In the first aspect of the invention, the predetermined current rate may be a current rate at which Li at a surface of a positive electrode active material particle decreases in the lithium ion secondary battery.

In the first aspect of the invention, when an open circuit voltage of the lithium ion secondary battery is lower than a predetermined threshold of the open circuit voltage, the state of charge of the lithium ion secondary battery may be estimated from the open circuit voltage based on second reference data indicating a correlation between an open circuit voltage and a state of charge of the reference lithium ion secondary battery. When the open circuit voltage of the lithium ion secondary battery is equal to or higher than the predetermined threshold of the open circuit voltage, the state of charge of the lithium ion secondary battery may be estimated based on the first reference data.

A state of charge estimation apparatus according to a second aspect of the invention includes: a charging device configured to charge a lithium ion secondary battery; an ammeter configured to measure a charge current of the charging device; a voltmeter configured to measure a voltage of the lithium ion secondary battery; a first storage unit configured to store a change in the measured voltage; a second storage unit in which first reference data are stored; and an estimation unit configured to estimate a state of charge of the lithium ion secondary battery. The first storage unit is configured to store the change in the measured voltage when the measured charge current has a predetermined current rate higher than or equal to a predetermined charging rate. The first reference data are data indicating, for each state of charge at a start of charging, a correlation between the predetermined current rate and a corresponding change in voltage of a reference lithium ion secondary battery from the start of charging when the reference lithium ion secondary battery is charged at the predetermined current rate. The estimation unit is configured to estimate the state of charge of the lithium ion secondary battery from the first reference data based on the change in the measured voltage, which change is stored in the first storage unit.

In the second aspect of the invention, multiple pieces of the first reference data respectively corresponding to mutually different current rates higher than or equal to the predetermined charging rate may be stored in the second storage unit. The estimation unit may be configured to select one of the multiple pieces of the first reference data stored in the second storage unit in accordance with in response to the current rate at which the first storage unit stores the change in the measured voltage. The estimation unit may be configured to estimate the state of charge of the lithium ion secondary battery based on the selected one of the multiple pieces of the first reference data.

In the second aspect of the invention, second reference data indicating a correlation between an open circuit voltage and a state of charge of the reference lithium ion secondary battery may be further stored in the second storage unit. The estimation unit may be configured to select the second reference data and estimate the state of charge from an open circuit voltage measured by the voltmeter when the open circuit voltage is lower than a predetermined threshold of the open circuit voltage.

The state of charge estimation apparatus according to the second aspect of the invention may further include a thermometer configured to measure a temperature of the lithium ion secondary battery. In addition, multiple pieces of third reference data respectively corresponding to mutually different temperatures of the reference lithium ion secondary battery may be stored in the second storage unit. The estimation unit may be configured to select one of the multiple pieces of the third reference data in accordance with the measured temperature, and estimate the state of charge of the lithium ion secondary battery based on the selected one of the third reference data.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 3 is a graph that shows the correlation between an SOC and a slope of an increase in voltage;

DETAILED DESCRIPTION OF EMBODIMENTS

Figure 1:
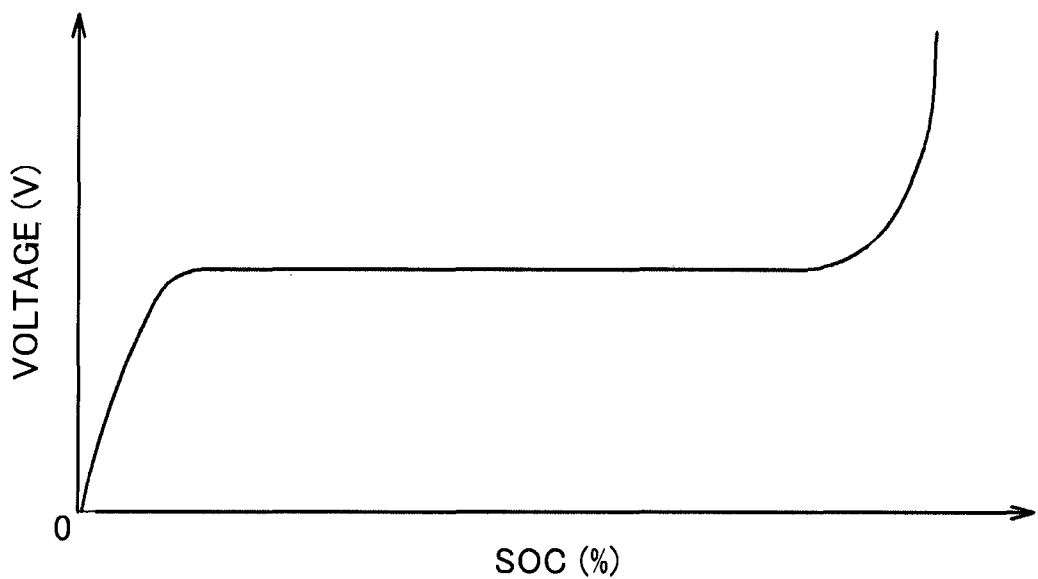
FIG. 1 is a graph that shows the OCV-SOC characteristic of a lithium ion secondary battery.

Hereinafter, a state of charge estimation method for a lithium ion secondary battery according to an embodiment of the invention will be described. The embodiment of the invention is not particularly intended to limit the invention. Each of the drawings is schematically drawn, and, for example, the dimensions (length, width, thickness, and the like) in each drawing do not reflect actual dimensions. Like reference numerals denote members or portions having the same functions, and the overlap description is omitted or simplified where appropriate.

FIG. 1 is a graph that shows the OCV-SOC characteristic of a lithium ion secondary battery. FIG. 1 shows a typical example of the OCV-SOC characteristic of a lithium ion secondary battery that uses $LiNi_{0.5}Mn_{1.5}O_4$ for a positive electrode active material. A NiMn spinel includes a positive electrode active material that contains another transition metal while keeping the basic structure of the NiMn spinel by, for example, replacing part of $LiNi_{0.5}Mn_{1.5}O_4$ with another transition metal. As shown in FIG. 1, in the lithium ion secondary battery that uses a positive electrode active material, such as $LiNi_{0.5}Mn_{1.5}O_4$, there is a region having such a tendency that the amount of change in OCV is small for the amount of change in SOC, particularly, in the state of charge where the SOC is higher than or equal to 50%. As shown in FIG. 1, the OCV in this region may be regarded as being substantially constant. For example, the OCV (voltage) of the lithium ion secondary battery that uses $LiNi_{0.5}Mn_{1.5}O_4$ is substantially constant from the state of charge where the SOC is higher than or equal to 50% to the state close to a full charge state (the SOC is 100%) (for example, the SOC is about 90%). In a battery that exhibits such a tendency, it is difficult to estimate the SOC (state of charge or remaining battery capacity) from the OCV (voltage).

Hereinafter, a mechanism that the lithium ion secondary battery degrades at a high potential will be described. The OCV (voltage) of the lithium ion secondary battery that uses $LiNi_{0.5}Mn_{1.5}O_4$ is substantially constant from the state of charge where the SOC is higher than or equal to 50% to the state close to the full charge state (the SOC is 100%) (for example, the SOC is about 90%). When the lithium ion secondary battery is further charged from the state where the SOC is about 90%, the voltage steeply increases. In an overcharged state, a transition metal (for example, Mn) contained in $LiNi_{0.5}Mn_{1.5}O_4$ may elute at a positive electrode, and may precipitate on a negative electrode. Mn precipitated on the surface of the negative electrode captures Li, and fixes Li on the surface of the negative electrode. Because Li fixed on the surface of the negative electrode does not contribute to the battery reaction of the lithium ion secondary battery, the capacity of the lithium ion secondary battery degrades or the internal resistance of the lithium ion secondary battery increases. As a result, the battery characteristic of the lithium ion secondary battery degrades.

In order to avoid the degradation of the lithium ion secondary battery, it is desirable to accurately estimate the SOC in a high SOC state, stop charging before the voltage steeply increases, and prevent an overcharged state of the lithium ion secondary battery. Prevention of the overcharged state is particularly effective for stable control over the lithium ion secondary battery. However, the lithium ion secondary battery has a substantially constant open circuit voltage (OCV) from the state of charge where the SOC is higher than or equal to 50% to about the state (for example, the SOC is 90%) close to the full charge state (the SOC is 100%). Therefore, in the region in which the open circuit voltage (OCV) is substantially constant, it is difficult to estimate the SOC from the open circuit voltage (OCV).

The inventors found that the rate of increase in voltage varies in accordance with an SOC when the lithium ion secondary battery that uses a NiMn spinel (for example, $LiNi_{0.5}Mn_{1.5}O_4$) for the positive electrode active material is charged at a relatively high current rate.

Figure 2:
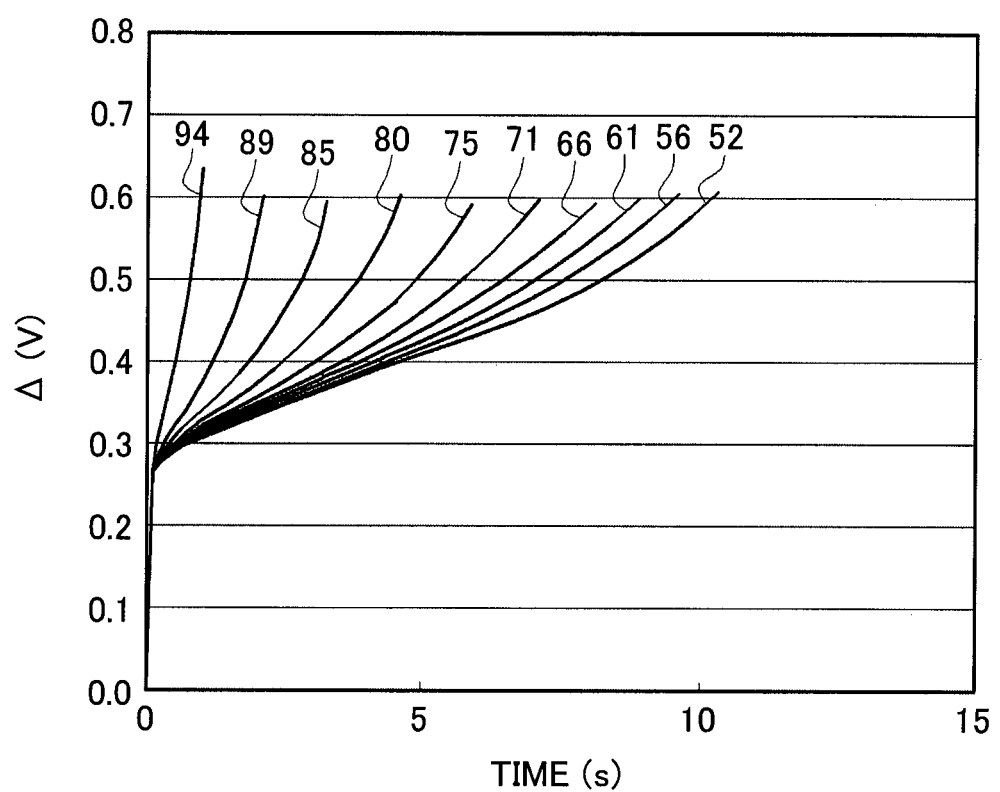
FIG. 2 is a graph of an overvoltage measured at the time when the lithium ion secondary battery is charged.

Hereinafter, the rate of increase in the voltage of the lithium ion secondary battery will be described with reference to FIG. 2. FIG. 2 is a graph of a change in voltage from an OCV (overvoltage) at the time when the lithium ion secondary battery is charged. More specifically, FIG. 2 shows a graph of a change in voltage measured at intervals of 0.1 seconds by charging the lithium ion secondary battery with an input pulse current at a rate of 30 C. The abscissa axis represents an elapsed time from the start of charging, the ordinate axis represents a voltage change (ΔV), and each of numeric values attached to the graphs indicates the SOC of the lithium ion secondary battery at the start of charging. FIG. 2 shows the correlation between an elapsed time (charging time) from the start of charging and a voltage change (ΔV) when the SOC is 94%, 89%, 85%, 80%, 75%, 71%, 66%, 61%, 56%, or 52%.

As shown in FIG. 2, when the lithium ion secondary battery is charged at a high current rate, such as 30 C, the voltage of the lithium ion secondary battery steeply increases by about 0.3 V just after the start of charging. After the voltage has steeply increased, the rate of increase in voltage decreases. The rate of increase in voltage is the rate of an increase in voltage to a charging time. The rate of increase in voltage corresponds to the slope of an increase in voltage in the graph shown in FIG. 2. According to the findings of the inventors, the rate of increase in voltage varies in accordance with the SOC of the lithium ion secondary battery. FIG. 3 is a graph that shows the correlation between an SOC and a slope of an increase in voltage. The inventors found that the SOC of the lithium ion secondary battery is estimated from the rate of increase in voltage, which is obtained in the case where the lithium ion secondary battery is charged at a relatively high current rate, such as 30 C, from the above findings.

Figure 4A:
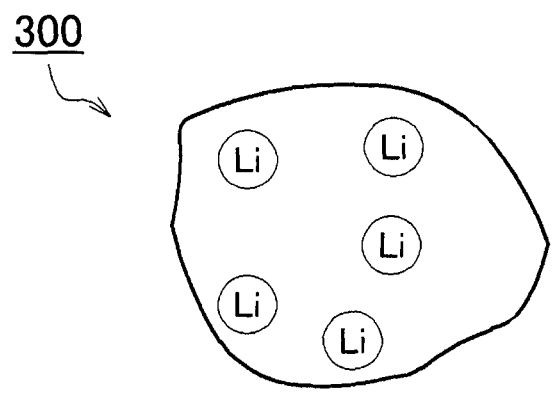
FIG. 4A shows a state of a NiMn spinel before the NiMn spinel is charged.
Figure 4B:
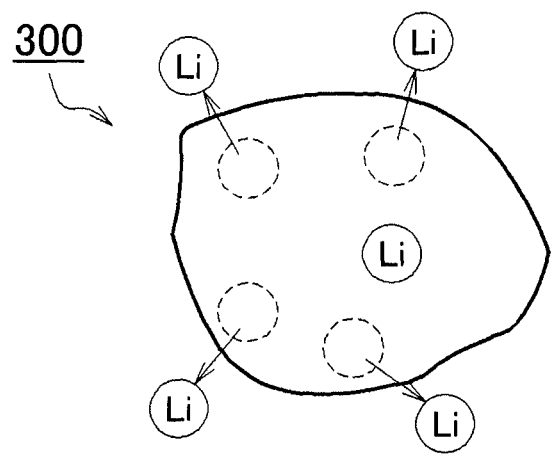
FIG. 4B shows a state of the NiMn spinel just after the start of charging the NiMn spinel.
Figure 4C:
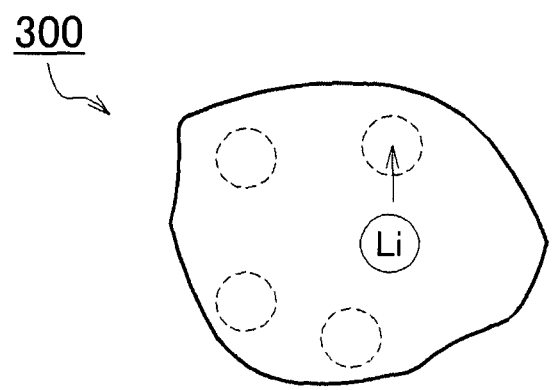
FIG. 4C shows a state of the NiMn spinel where the amount of Li at the surface of the particle has decreased because of diffusion of Li after the start of charging the NiMn spinel.

FIG. 4A to FIG. 4C schematically show a change in the state of a primary particle of a NiMn spinel 300 (for example, $LiNi_{0.5}Mn_{1.5}O_4$) that is used for the positive electrode active material. FIG. 4A shows a state of the NiMn spinel 300 before the NiMn spinel 300 is charged. FIG. 4B shows a state of the NiMn spinel 300 just after the start of charging the NiMn spinel 300. FIG. 4C shows a state of the NiMn spinel 300 where the amount of Li at the surface of the particle has decreased because of diffusion of Li after the start of charging the NiMn spinel 300.

As shown in FIG. 4A, the NiMn spinel 300 contains a large amount of Li near the surface of the particle or inside the particle before charging. Because the NiMn spinel 300 has a strong crystal structure, it is possible to carry out charging until almost all the Li in the particle is emitted. As shown in FIG. 4B, when the NiMn spinel 300 is charged at a relatively high current rate, such as 30 C, Li near the surface of the NiMn spinel 300 is initially emitted. In addition, as shown in FIG. 4C, Li inside the NiMn spinel 300 migrates to the surface of the NiMn spinel 300, and is emitted from the surface of the particle where necessary. It is known that the NiMn spinel particularly provides a two-phase coexistence reaction in a high SOC region. Therefore, the phenomenon that the voltage increases in the case where the NiMn spinel 300 is charged at a relatively high current rate, such as 30 C, may be strictly regarded as a phenomenon due to not diffusion of Li but a phase change of each crystallite.

When the states of FIG. 4A to FIG. 4C are compared with the graph shown in FIG. 2, the voltage of the lithium ion secondary battery steeply increases by about 0.3 V just after the start of charging when the lithium ion secondary battery is charged at a high current rate, such as 30 C. This may be regarded as being dependent on a direct-current resistance component or an electric charge migration resistance component on the surface of each particle and almost not being dependent on the SOC in the case of the NiMn spinel. After that, in high-rate charging, an overvoltage further increases with time because of, for example, the reason why the Li diffusion rate inside each particle is controlled and, as a result, the concentration of Li on the surface of each particle is not kept any more. Finally, in the state where there is almost no Li on the surface of each particle as shown in FIG. 4C, it becomes difficult to flow current, so a change in voltage increases to a near-vertical slope.

As the SOC at the start of charging becomes higher, the amount of Li remaining inside each particle becomes smaller. As the SOC at the start of charging becomes higher, the concentration of Li at the surface of each particle decreases earlier, so the rate of increase in voltage tends to increase. In contrast, as the SOC at the start of charging becomes lower, the amount of Li remaining inside each particle becomes larger. As the SOC at the start of charging becomes lower, the concentration of Li at the surface of each particle is kept high, so the rate of increase in voltage tends to be suppressed to a lower rate. For example, when a large amount of Li remains inside each particle as in the case where the SOC is 50%, the rate of increase in voltage is gentle. In contrast, the amount of Li remaining inside each particle decreases as the SOC increases, so the voltage more easily increases, and the rate of increase in voltage increases.

The above phenomenon occurs when the lithium ion secondary battery is charged at such a high current rate that Li is emitted from the surface of each particle of the NiMn spinel at a rate higher than the rate at which Li inside each particle migrates to the surface of the particle (the diffusion rate of Li inside each positive electrode active material particle). According to such a phenomenon, it is possible to estimate the state of each positive electrode active material particle (the amount of Li remaining inside each positive electrode active material particle) from the rate of increase in voltage, and to further estimate the state of charge of the lithium ion secondary battery. That is, when the lithium ion secondary battery is charged at such a high current rate that the rate of increase in voltage is controlled to the rate at which Li inside each particle migrates to the surface of the particle and is emitted where necessary, it is possible to estimate the SOC from the rate of increase in voltage.

The above-described phenomenon also occurs in the case where the positive electrode active material having such a structure that it is possible to emit almost all the Li in each particle at the time of charging is used as in the case where the NiMn spinel is used for the positive electrode active material. In contrast, when active material particles each having a layer particle structure, such as lithium-nickel-manganese-cobalt composite oxide, are used for the positive electrode active material, it is not possible to charge the lithium ion secondary battery until almost all the Li in each particle is emitted in terms of the structure of each particle. When active material particles each having a layer structure are used for the positive electrode active material, a large amount of Li remains inside each particle irrespective of the SOC. Therefore, even when the lithium ion secondary battery is charged at a high current rate, such as 30 C, the rate of increase in voltage does not vary so much with the SOC. Therefore, the lithium ion secondary battery that uses active material particles each having a layer structure for the positive electrode active material is not suitable for application of the state of charge estimation method according to the embodiment of the invention.

As described above, the state of charge estimation method for a lithium ion secondary battery according to the embodiment of the invention is particularly suitable for the lithium ion secondary battery that uses such active material particles that, when the lithium ion secondary battery is charged at a high current rate, the rate of increase in voltage is controlled to the rate at which Li inside each particle migrates to the surface of the particle and is emitted where necessary, for the positive electrode active material. The state of charge estimation method for a lithium ion secondary battery according to the embodiment of the invention is applicable to the lithium ion secondary battery in which active material particles each having a spinel structure or an olivine structure or other polyanionic active material particles are applied as the positive electrode active material.

Examples of the positive electrode active material include Mn spinel active material particles, NiMn spinel active material particles, olivine active material particles, and other polyanionic active material particles. More particularly, the positive electrode active material includes $LiMn_2O_4$, $LiNi_{0.5}Mn_{1.5}O_4$, element-substituted compounds of these, and polyanionic positive electrode active material particles, such as $LiFePO_4$, $LiMnPO_4$, $LiCoPO_4$, $LiNiPO_4$, $Li_3Fe_2(PO_4)_3$, $LiFeSiO_4$, $LiFeBO_3$, $LiVOPO_4$, and $Li_3V_2(PO_4)_3$.

The active material particles illustrated here may be partially added (or substituted) as needed with one or two or more transition metals, such as Mg, Al, Co, Zr, Mo, Nb, Fe, Ti, and W, to such an extent that the crystal structure is kept. When such active material particles that the rate of increase in voltage is controlled to the rate at which Li inside each particle migrates to the surface of the particle and is emitted where necessary in the case where the lithium ion secondary battery is charged at a high current rate are used for the positive electrode active material, the material that is used for the positive electrode active material particles may be made of one material or may be made by mixing two or more materials having different compositions.

The state of charge estimation method for a lithium ion secondary battery according to the embodiment of the invention includes a step of charging the lithium ion secondary battery and a step of estimating the state of charge of the lithium ion secondary battery. Hereinafter, the case where the state of charge estimation method for a lithium ion secondary battery according to the embodiment of the invention further includes a step of preparing reference data will be described.

The reference data include the correlation between the state of charge and the rate of increase in voltage in the case where a lithium ion secondary battery, which is the same type as the lithium ion secondary battery of which the state of charge is estimated, is charged at a current rate higher than or equal to a predetermined charging rate.

In the step of preparing reference data, the lithium ion secondary battery that is the same type as the lithium ion secondary battery of which the state of charge is estimated may be prepared. After the lithium ion secondary battery of the same type is subjected to a predetermined activation step, the state of charge (SOC) is adjusted. After the state of charge (SOC) is adjusted, the lithium ion secondary battery of the same type may be charged at the current rate higher than or equal to the predetermined charging rate, and then the rate of increase in voltage may be obtained.

In the step of preparing reference data, in adjusting the state of charge, the rated capacity of the lithium ion secondary battery of the same type is measured. The SOC may be adjusted by discharging a predetermined quantity of electricity with respect to the rated capacity from the state where the SOC is 100%. The rated capacity varies depending on the specifications of the lithium ion secondary battery. Setting of the state where the SOC is 100% or the state where the SOC is 0% may be arbitrarily determined.

In the step of preparing reference data, for the lithium ion secondary battery in which $LiNi_{0.5}Mn_{1.5}O_4$ is used for the positive electrode active material and graphite is used for a negative electrode active material, the state where the lithium ion secondary battery is charged up to 4.8 V through constant voltage and constant current charge (CCCV charge) may be determined as the state where the SOC is 100%. The state where the lithium ion secondary battery is discharged up to 3.5 V through constant voltage and constant current discharge (CCCV discharge) may be determined as the state where the SOC is 0%. The lithium ion secondary battery is discharged from the state where the lithium ion secondary battery has been charged up to 4.8 V through constant voltage and constant current charge (CCCV charge) (the state where the SOC is 100%) to the state where the lithium ion secondary battery is discharged up to 3.5 V through constant voltage and constant current discharge (CCCV discharge) (the state where the SOC is 0%). The quantity of electricity discharged at this time is determined as the rated capacity. The SOC is adjusted by discharging a required quantity of electricity from the state where the SOC is 100%. The SOC may be adjusted to the state where the SOC is 80% by discharging the quantity of electricity corresponding to 20% of the rated capacity from the state where the SOC is 100%. Similarly, the SOC may be adjusted to the state where the SOC is 60% by discharging the quantity of electricity corresponding to 40% of the rated capacity from the state where the SOC is 100%.

Subsequently, after the state of charge (SOC) is adjusted, the lithium ion secondary battery is charged at the current rate higher than or equal to the predetermined charging rate, and the rate of increase in voltage is obtained. The current rate higher than or equal to the predetermined charging rate just needs to be such a current rate that the rate of increase in voltage is controlled to the rate at which Li inside each particle migrates to the surface of the particle and is emitted where necessary. The current rate higher than or equal to the predetermined charging rate is desirably a current rate higher than or equal to 20 C. Multiple pieces of the reference data may be respectively set for current rates higher than or equal to the predetermined charging rate. The current rates prepared here may be arbitrarily set, and may be set to, for example, a current rate of 25 C and a current rate of 30 C.

Multiple pieces of the reference data may be further prepared respectively for temperatures. In this way, multiple pieces of the reference data may be prepared respectively in correspondence with current rates or temperatures during charging.

Figure 5:
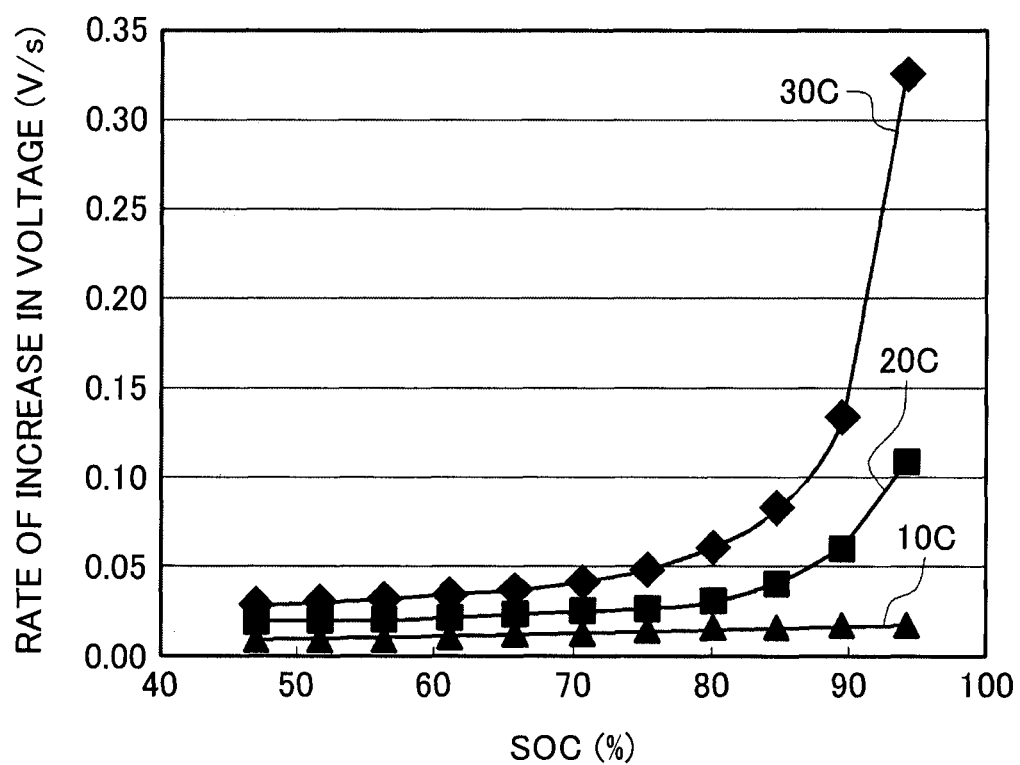
FIG. 5 shows an example of pieces of reference data at different current rates during charging.

FIG. 5 shows an example of multiple pieces of reference data respectively corresponding to different current rates during charging. In the example shown in FIG. 5, the case where the charging current rate is 10 C, 20 C, or 30 C is shown. In this example, when the charging current rate is 10 C, a change in the rate of increase in voltage is small. In contrast, as in the case where the charging current rate is 20 C or 30 C, as the charging rate increases, a change in the rate of increase in voltage becomes larger, with the result that the SOC is further accurately estimated.

The rate of increase in voltage is the rate of increase in voltage from a start point that is set at a point in time at which a predetermined time has elapsed from the start of charging. The predetermined time from the start of charging may be specifically set to a time that is taken from the start of charging at a high charging rate to the start of an increase in voltage due to the influence of diffusion of Li. The time that is taken from the start of charging at a high charging rate to the start of an increase in voltage due to the influence of diffusion of Li corresponds to a time that is taken until an electric charge migration reaction at the surface of each positive electrode active material particle completes. That is, the predetermined time may be set to a time that is taken until the rate of increase in voltage steeply increased from the start of charging becomes gentle. Alternatively, the predetermined time may be regarded as a time that is taken until the rate of increase decreases to a predetermined value or lower. The predetermined time from the start of charging may be set to about 0.1 seconds from the start of charging. The time that is taken until the rate of increase in voltage steeply increased from the start of charging becomes gentle is, for example, set to about the range of 0.01 seconds to 0.2 seconds in accordance with the specifications or temperature of the battery.

In the step of charging, the lithium ion secondary battery is charged at the current rate higher than or equal to the predetermined charging rate, and the voltage of the lithium ion secondary battery is measured. That is, in the step of charging, the lithium ion secondary battery of which the state of charge is estimated is charged at the current rate higher than or equal to the predetermined charging rate. The voltage of the lithium ion secondary battery is measured. In this case, as shown in FIG. 2, changes in voltage change ($\Delta V$) from the start of charging may be obtained. On the other hand, although not always required to be obtained in form of the graph as shown in FIG. 2, the voltage change ($\Delta V$) may be intermittently recorded from the start of charging. For example, changes in voltage change ($\Delta V$) per 0.1 seconds from the start of charging are recorded as data. A voltage may be recorded as data from the start of charging, and then a voltage change ($\Delta V$) may be obtained from a difference of the voltage from the voltage (OCV) at the start of charging (or before the start of charging). In the step of charging, a temperature may be recorded. In this case, a temperature measured at a predetermined location with respect to the lithium ion secondary battery may be recorded.

In the step of estimating the state of charge, the rate of increase in voltage is obtained from the voltages measured in the step of charging. The state of charge of the lithium ion secondary battery is estimated on the basis of the rate of increase in voltage and the reference data. In the step of estimating the state of charge, as described above, the rate of increase in voltage is the rate of increase in voltage from a start point that is set at a point in time at which the predetermined time has elapsed from the start of charging. For example, the rate of increase in voltage is defined on the basis of a predetermined amount of change in voltage from a start point and a time that is taken until the voltage increases. The start point is set at a point in time at which the predetermined time has elapsed from the start of charging. For example, the rate of increase in voltage is defined on the basis of a time that is taken until the voltage increases by 0.2 V from a start point that is set at a point in time at which 0.1 seconds has elapsed from the start of charging. In this case, the rate of increase in voltage (V/s) is defined as 0.2 V/(time that is taken until the voltage increases by 0.2V from the start point).

For example, the rate of increase in voltage (V/s) is defined on the basis of the amount of increase in voltage for the predetermined time from a start point that is set at a point in time at which the predetermined time has elapsed from the start of charging. For example, the rate of increase in voltage is defined on the basis of the amount of increase in voltage ($\Delta V1$) increased for 0.2 seconds from a start point that is set at a point in time at which 0.1 seconds has elapsed from the start of charging. In this case, the rate of increase in voltage (V/s) is defined as the amount of increase in voltage ($\Delta V1$)/ 0.2 seconds.

In the step of estimating the state of charge, the state of charge of the lithium ion secondary battery is estimated on the basis of the above-described rate of increase in voltage and reference data. In the step of estimating the state of charge, appropriate reference data may be selected from among multiple pieces of reference data prepared respectively in correspondence with current rates or temperatures during charging. With the state of charge estimation method for a lithium ion secondary battery, it is possible to estimate the SOC of the lithium ion secondary battery. The state of charge estimation method according to the embodiment of the invention is particularly suitable for a battery that is chargeable until almost all the Li in each positive electrode active material particle is emitted.

Hereinafter, a method of correcting an evaluation of the SOC in the case where the capacity of the lithium ion secondary battery has degraded as a result of usage of the lithium ion secondary battery will be described.

As described above, according to the findings of the inventors, as the amount of Li remaining inside each positive electrode active material particle becomes smaller, the rate of increase in voltage becomes higher; whereas, as the amount of Li remaining inside each positive electrode active material particle increases, the rate of increase in voltage decreases. In this way, the rate of increase in voltage has a direct correlation with the state of each positive electrode active material particle (the amount of Li remaining inside each positive electrode active material particle). The SOC of the lithium ion secondary battery is estimated on the basis of the state of each positive electrode active material particle (the amount of Li remaining inside each positive electrode active material particle).

Figure 6:
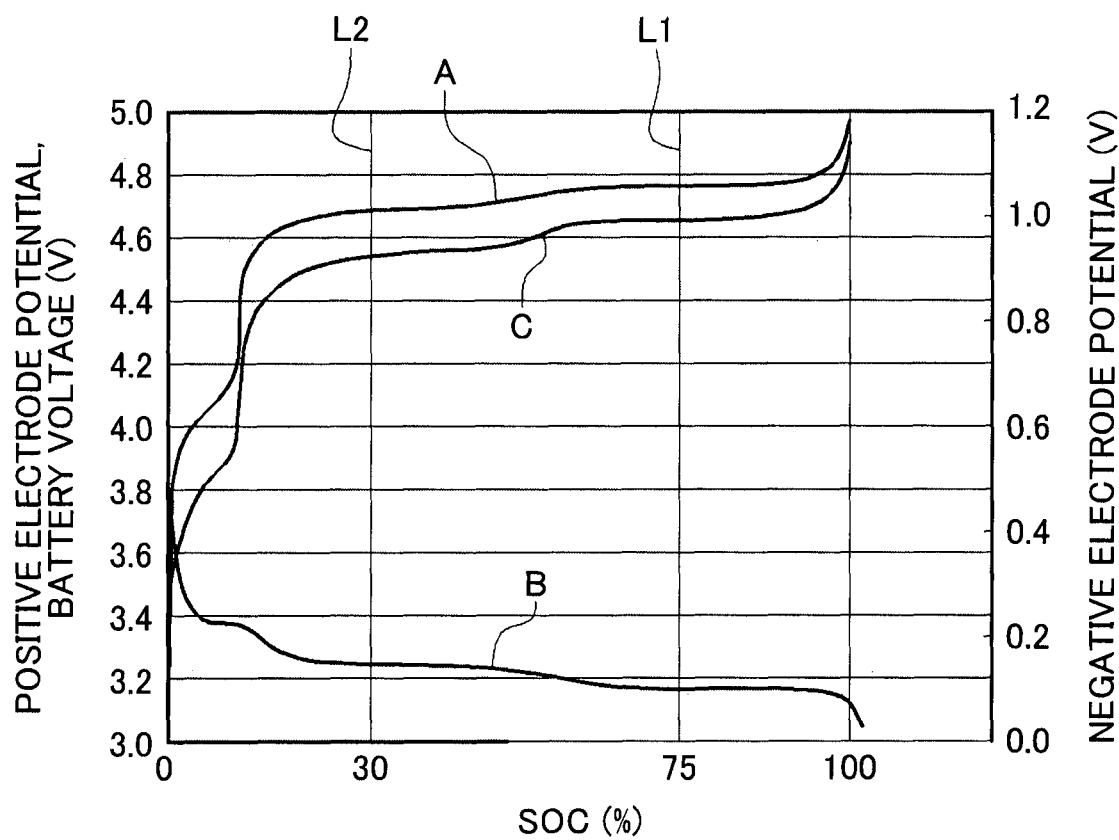
FIG. 6 shows the correlation between a battery capacity (SOC) and a positive electrode potential, a negative electrode potential or a battery voltage (OCV) in the lithium ion secondary battery.

FIG. 6 shows the correlation between a battery capacity (SOC) and a positive electrode potential, a negative electrode potential, or a battery voltage (OCV) in the lithium ion secondary battery. More specifically, FIG. 6 shows the above correlation for the lithium ion secondary battery that uses $LiNi_{0.5}Mn_{1.5}O_4$ for the positive electrode active material. In FIG. 6, the graph A shows the correlation between a positive electrode potential and a battery capacity (SOC). The graph B shows the correlation between a negative electrode potential and a battery capacity (SOC). The graph C shows the correlation between a battery voltage (OCV) and a battery capacity (SOC). In FIG. 6, the positive electrode potential and the negative electrode potential each are defined by setting the equilibrium potential of the lithium metal electrode for 0 V reference (vs. $Li^+/Li$). The battery voltage (OCV) corresponds to the difference between the positive electrode potential and the negative electrode potential.

In the example shown in FIG. 6, in the initial state where no capacity degradation has occurred, the state where the positive electrode potential is 3.5 V is defined as the state where the SOC is 0%, and the state where the positive electrode potential is 4.8 V is defined as the state where the SOC is 100%. In the example shown in FIG. 6, the quantity of electricity that is charged at the time when the lithium ion secondary battery is charged from the state where the SOC is 0% to the state where the SOC is 100% is determined as the rated capacity. In the example shown in FIG. 6, the line L1 is set at the position of the state where the SOC is 75%. That is, the line L1 indicates the position at which the lithium ion secondary battery has been charged to 75% of the rated capacity.

Figure 7:
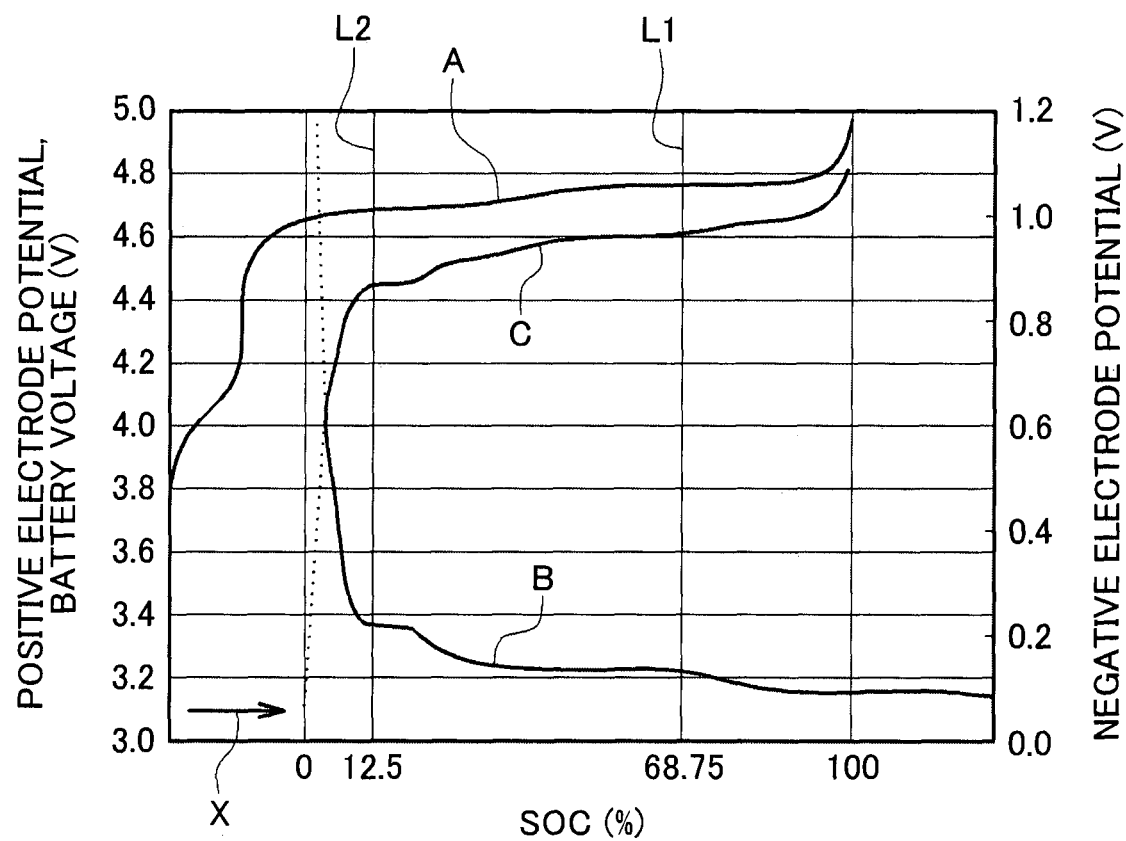
FIG. 7 shows the correlation between a battery capacity (SOC) and a positive electrode potential, a negative electrode potential or a battery voltage (OCV) in the case where the capacity of the lithium ion secondary battery shown in FIG. 6 has degraded by 20%.

FIG. 7 shows the correlation between a battery capacity (SOC) and a positive electrode potential, a negative electrode potential or a battery voltage (OCV) in the case where the capacity of the lithium ion secondary battery shown in FIG. 6 has degraded by 20%. As shown in FIG. 7, even when the capacity has degraded, the rate of increase in voltage has a direct correlation with the state of each positive electrode active material particle (the amount of Li remaining inside each positive electrode active material particle). Therefore, with the state of charge estimation method according to the embodiment of the invention, even when Li is fixed on the surface of the negative electrode and, as a result, capacity degradation occurs, the state of each positive electrode active material particle (the amount of Li remaining inside each positive electrode active material particle) is similarly evaluated. That is, the lithium ion secondary battery that uses $LiNi_{0.5}Mn_{1.5}O_4$ for the positive electrode active material is chargeable until almost all the Li in each positive electrode active material particle is emitted. Therefore, even when the capacity has degraded, the positive electrode potential at the state where the SOC is 100% remains unchanged, so the rate of increase in voltage is similarly evaluated.

However, when there occurs capacity degradation, Li is fixed on the surface of the negative electrode, so Li that contributes to the battery reaction is lost at the negative electrode. Therefore, the battery capacity of the lithium ion secondary battery decreases. FIG. 7 shows the case where the capacity of the lithium ion secondary battery shown in FIG. 6 has degraded by 20%. In FIG. 7, the state where the battery capacity has decreased by 20% is expressed by shifting the negative electrode potential (B) in the arrow X direction with respect to the positive electrode potential (A). In this case, although the positive electrode potential at the state where the SOC is 100% does not change, the position of the positive electrode at the state where the SOC is 0% is changed. The line L1 in FIG. 7 indicates the position at which the battery capacity (SOC) is set to 75% with respect to the positive electrode potential in the initial state where no capacity degradation has occurred. At this position, it is not adequate to evaluate the battery capacity (SOC) as 75% in the state where the battery capacity of the lithium ion secondary battery has decreased by 20%. In this case, in the state where the battery capacity of the lithium ion secondary battery has decreased by 20%, the position of the line L1 may be evaluated by correcting the battery capacity (SOC) as (75−20)/(100−20)=68.75%. In this way, an evaluation of the SOC with reference to the positive electrode potential may be corrected to a lower value in accordance with the degree of degradation of the battery capacity of the lithium ion secondary battery.

In this way, in the state of charge estimation method according to the embodiment of the invention, an evaluation of the SOC may be corrected in accordance with the proportion of capacity degradation separately with a method of evaluating the capacity degradation of the lithium ion secondary battery when it is evaluated that the capacity has degraded.

In addition, in such a battery, for example, such a phenomenon that the capacity degrades as a result of usage of the battery up to near the state where the SOC is 100% (usage in an overcharged state) may be prevented through control with the range of usage set to about the range of the state where the SOC is 30% to the state where the SOC is 70% in the initial state. In addition, in the case where the capacity has degraded, when an evaluation of the SOC is corrected to a lower value with reference to the positive electrode potential in accordance with the degree of degradation of the battery capacity as described above, an evaluation of the SOC with reference to the positive electrode changes. As described above, in the state where the battery capacity of the lithium ion secondary battery has decreased by 20%, the state where the SOC is 30% after correction becomes about the state where the SOC is 54% before correction where the positive electrode potential is set for a reference. The state where the SOC is 70% after correction becomes the state where the SOC is about 76% before correction. Where the positive electrode potential is set for a reference, at the position corresponding to the position L2 of the state where the SOC is 30% before correction shown in FIG. 6, the SOC after correction shown in FIG. 7 becomes 12.5%. That is, even when the SOC after correction is 12.5%, the state of the positive electrode has a potential corresponding to the state where the SOC is 30% in the initial state. The state where the SOC is 30% after correction has an allowance for the state of the positive electrode.

Capacity degradation mainly occurs because of an overcharged state of the positive electrode as described above. In consideration of this point, as shown in FIG. 7, when the negative electrode potential (B) is shifted with respect to the positive electrode potential (A) and the SOC is evaluated by correcting the SOC with reference to the positive electrode potential (A), the range of usage does not need to be kept within the range of the state where the SOC is 30% to the state where the SOC is 70% after correction. In this case, a lower limit of the range of usage may be changed to a low SOC region in accordance with correction of the SOC. That is, as shown in FIG. 7, when an evaluation of the SOC is corrected in accordance with the degradation of 20%, the state of the positive electrode is just the state where the SOC is 30% before correction even when the SOC is 12.5%, so the lower limit of the range of usage may be changed to about the state where the SOC is 12.5%. In this way, by changing the lower limit of the range of usage to the low SOC region in accordance with correction of the SOC, the capacity of the lithium ion secondary battery may be ensured.

The state of charge estimation method according to the embodiment of the invention is based on the amount of Li remaining in each positive electrode active material particle and the diffusibility of Li in each positive electrode active material particle. Therefore, the state of charge estimation method according to the embodiment of the invention is difficult to be influenced by an electrolytic solution or the negative electrode. The state of charge estimation method according to the embodiment of the invention is, for example, difficult to be influenced by, for example, surface coating. Therefore, it is possible to accurately estimate the state of charge of the lithium ion secondary battery over an extended period of time in accordance with an aged change of the lithium ion secondary battery.

Figure 8:
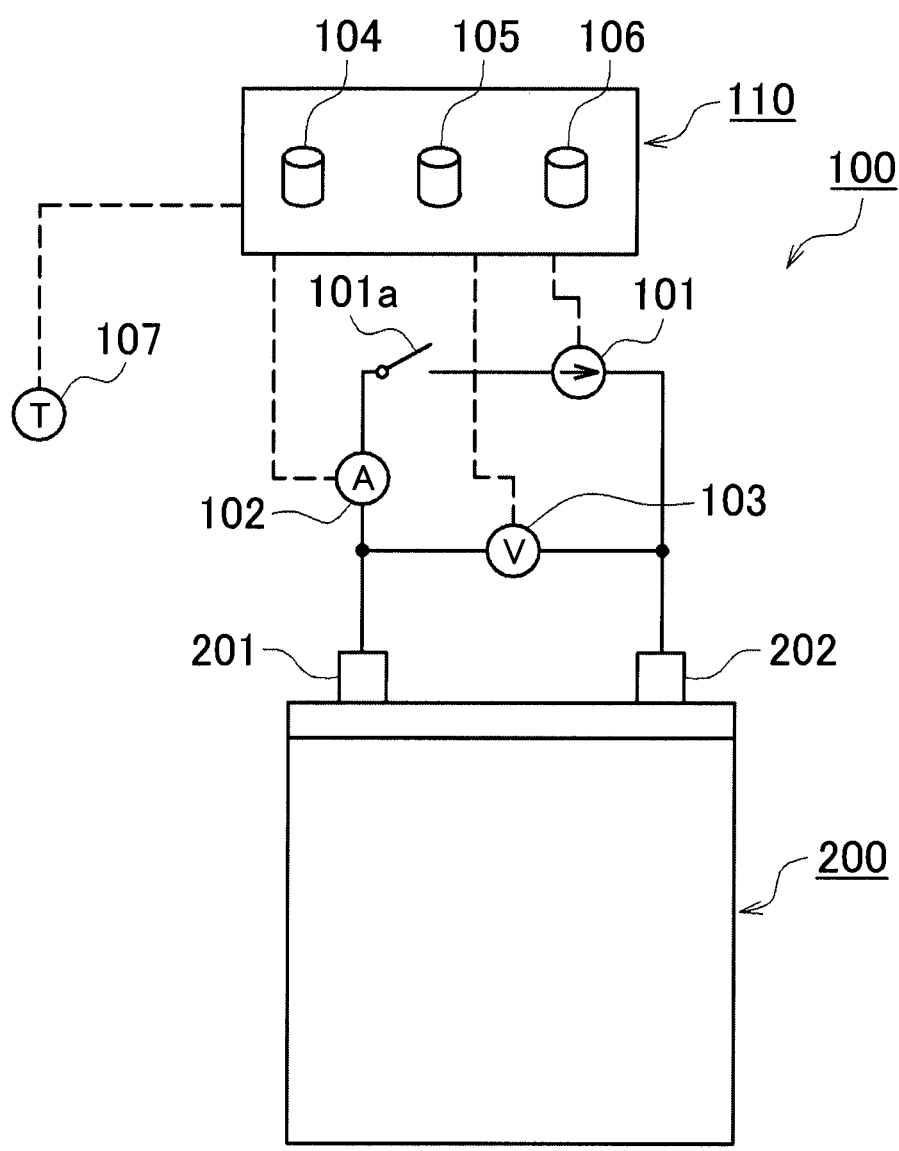
FIG. 8 is a schematic view that shows a state of charge estimation apparatus for a lithium ion secondary battery according to an embodiment of the invention.

Next, a state of charge estimation apparatus for a lithium ion secondary battery according to an embodiment of the invention will be described. FIG. 8 is a schematic view that schematically shows the state of charge estimation apparatus for a lithium ion secondary battery according to the embodiment of the invention. The state of charge estimation apparatus 100 described here is an apparatus configured to execute the above-described state of charge estimation method for a lithium ion secondary battery.

As shown in FIG. 8, the state of charge estimation apparatus 100 includes a charging device 101, an ammeter 102, a voltmeter 103, a first storage unit 104, a second storage unit 105, and an estimation unit 106. The state of charge estimation apparatus 100 includes an arithmetic processing unit 110 formed of a computer that combines an electrical arithmetic processing device with a storage device. The first storage unit 104, the second storage unit 105 and the estimation unit 106 are implemented by arithmetic processing along with predetermined programs in the arithmetic processing unit 110 of the state of charge estimation apparatus 100.

The charging device 101 is a device that charges the lithium ion secondary battery 200, and is electrically connected to a positive electrode terminal 201 and negative electrode terminal 202 of the battery 200. The charging device 101 includes a switching mechanism 101a. The ammeter 102 is a device that measures the charge current of the charging device 101, and is connected in series with the charging device 101. The voltmeter 103 is a device that measures the voltage of the lithium ion secondary battery 200, and is connected in parallel with the charging device 101.

The first storage unit 104 stores changes in voltage, measured by the voltmeter 103. The second storage unit 105 stores reference data. The estimation unit 106 estimates the state of charge of the lithium ion secondary battery 200 The state of charge estimation apparatus 100 uses the measured results measured by the ammeter 102 and the voltmeter 103 as input data, and estimates the state of charge (SOC) of the lithium ion secondary battery 200 through predetermined arithmetic processing in the estimation unit 106.

The first storage unit 104 may store changes in voltage, measured by the voltmeter 103, at least when the charge current measured by the ammeter 102 has a current rate higher than or equal to the predetermined charging rate. The current rate higher than or equal to the predetermined charging rate may be set to such a high current rate that the rate of increase in voltage is controlled to the rate at which Li inside each particle migrates to the surface of the particle and is emitted where necessary. In this case, the current rate higher than or equal to the predetermined charging rate may be set to a current rate higher than or equal to 20 C, more desirably a current rate higher than or equal to 25 C, and further desirably a current rate higher than or equal to 30 C.

The reference data stored in the second storage unit 105 may be such data that the correlation between a current rate higher than or equal to the predetermined charging rate in the case where a lithium ion secondary battery, which is the same type as the lithium ion secondary battery 200 of which the state of charge is estimated, is charged at the current rate and changes in voltage from the start of charging is recorded for each state of charge at the start of charging.

The estimation unit 106 may estimate the state of charge of the lithium ion secondary battery from the reference data stored in the second storage unit 105 on the basis of the changes in voltage, stored in the first storage unit 104.

The state of charge estimation apparatus 100 is, for example, used as means for estimating the state of charge of the lithium ion secondary battery that serves as a driving source in a vehicle, such as a hybrid vehicle and an electric vehicle, that can use electricity stored in the battery. In this case, for example, at the time of charging regenerative energy that is generated at the time of stopping the vehicle, a high charge current is generated. In this case, when the charge current measured by the ammeter 102 has a current rate higher than or equal to the predetermined charging rate, changes in voltage, measured by the voltmeter 103, are stored in the first storage unit 104. The estimation unit 106 estimates the state of charge of the lithium ion secondary battery from the reference data stored in the second storage unit 105 on the basis of the changes in voltage, stored in the first storage unit 104.

In this case, multiple pieces of the reference data may be respectively stored in the second storage unit 105 in correspondence with current rates higher than or equal to the predetermined charging rate. The estimation unit 106 may select the reference data to be referenced from among the multiple pieces of reference data stored in the second storage unit 105 in accordance with a current rate at the time when the changes in voltage, measured by the voltmeter 103, are stored in the first storage unit 104. Thus, the state of charge of the lithium ion secondary battery 200 is accurately estimated in accordance with the current rate higher than or equal to the predetermined charging rate.

Even the lithium ion secondary battery that uses active material particles, such as the NiMn spinel, for the positive electrode active material also has a correlation between an open circuit voltage (OCV) and a state of charge (SOC), for example, in a low SOC state where the SOC is lower than or equal to 50%. In this case, it is possible to estimate the state of charge from the open circuit voltage. Therefore, the second storage unit 105 may further store reference data in which the correlation between an open circuit voltage and state of charge of the lithium ion secondary battery, which is the same type as the lithium ion secondary battery 200 of which the state of charge is estimated, is recorded. When a threshold is provided for the open circuit voltage in advance and the open circuit voltage measured by the voltmeter 103 is lower than the predetermined threshold of the open circuit voltage, the estimation unit 106 may select reference data in which the correlation between an open circuit voltage and a state of charge is recorded from among the pieces of reference data stored in the second storage unit 105, and may estimate the SOC from the open circuit voltage measured by the voltmeter 103. In this way, when the open circuit voltage measured by the voltmeter 103 is low, the SOC may be estimated where appropriate from the open circuit voltage measured by the voltmeter 103. Thus, it is possible to select a simple method where appropriate.

Multiple pieces of reference data may be respectively prepared in correspondence with temperatures as the reference data stored in the second storage unit 105. In this case, as shown in FIG. 8, the state of charge estimation apparatus 100 may include a thermometer 107. In this case, the estimation unit 106 may select reference data to be referenced from among the multiple pieces of reference data stored in the second storage unit 105 in accordance with the temperature measured by the thermometer 107. In this case, the state of charge of the lithium ion secondary battery 200 is accurately estimated in accordance with the temperature.

Figure 9:
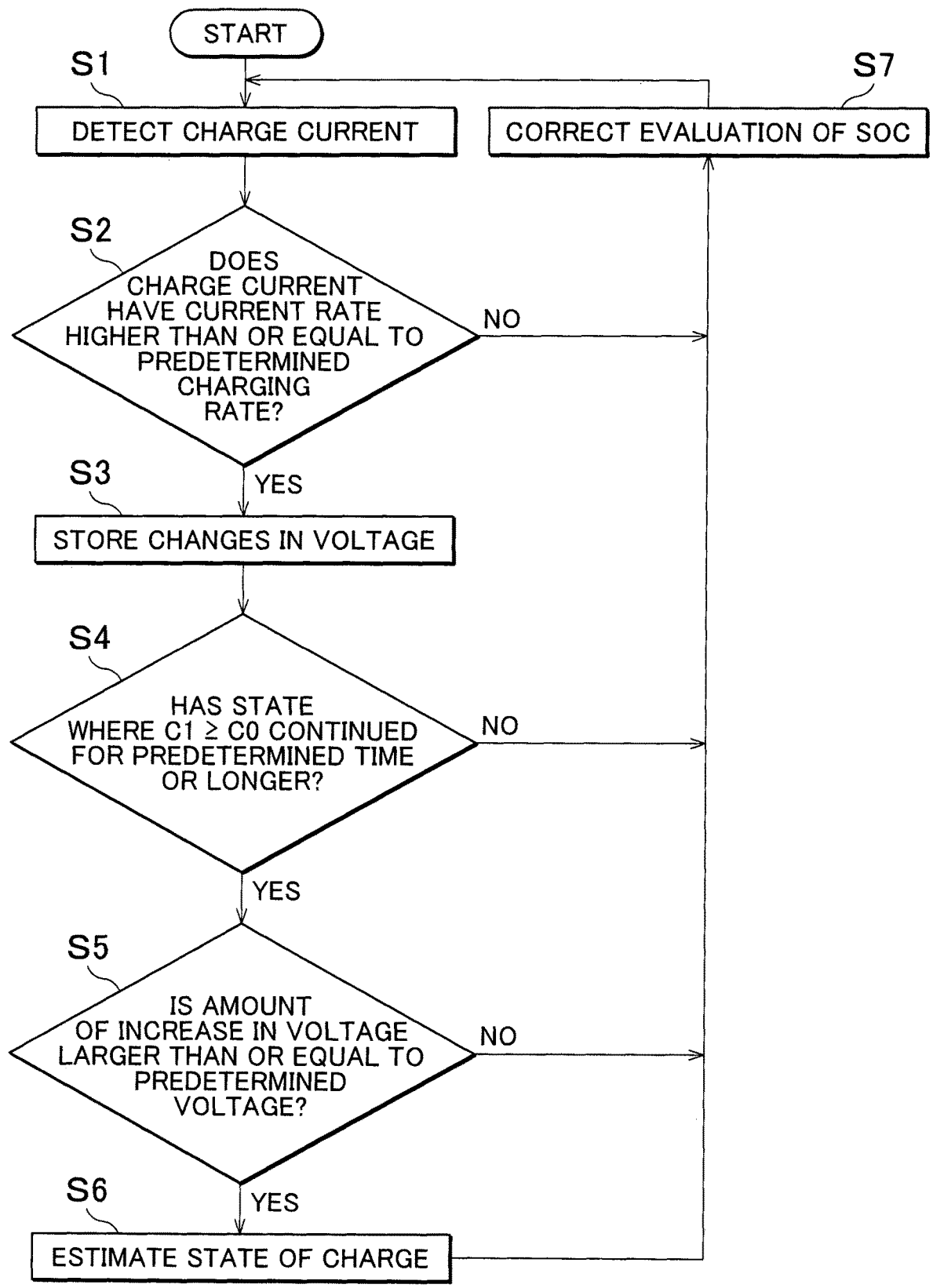
FIG. 9 is a flowchart that shows the processing flow in which a state of charge is estimated by the state of charge estimation apparatus.

FIG. 9 is a flowchart that shows the processing flow in which the state of charge is estimated by the state of charge estimation apparatus 100. The processing flow illustrated here includes the following step S1 to step S7. The processing flow illustrated here is only one embodiment, and does not limit the state of charge estimation apparatus 100 or the state of charge estimation method unless otherwise specified.

Initially, the fact that the charge current measured by the ammeter 102 has a current rate higher than or equal to the predetermined charging rate is detected. In the processing flow, as shown in FIG. 9, the charge current measured by the ammeter 102 is detected (S1). Subsequently, it is determined whether the charge current detected in step S1 has a current rate higher than or equal to the predetermined charging rate (S2). That is, a determination process in which it is determined whether a charge current C1 measured by the ammeter 102 has a current rate higher than or equal to a predetermined charging rate C0 is executed. When C1 is higher than or equal to C0 (YES) in the determination process (S2), the process of storing changes in voltage, measured by the voltmeter 103, in the first storage unit 104 may be executed (S3). When C1 is not higher than or equal to C0 (NO) in the determination process (S2), the process may be returned to step S1 in which the charge current measured by the ammeter 102 is detected.

Subsequently, it may be determined whether the charge current C1 detected in step S1 has a current rate higher than or equal to the predetermined charging rate C0 and has continued for a predetermined time or longer (S4). Thus, in the state of charge estimation method applied here, the situation that the current rate higher than or equal to the predetermined charging rate has not continued for the predetermined time or longer and it is not suitable to obtain the rate of increase in voltage (NO) may be excluded. Subsequently, it may be determined whether an increase in voltage is larger than or equal to a predetermined voltage (S5). Thus, in the state of charge estimation method applied here, the situation that an increase in voltage is not larger than or equal to the predetermined voltage and it is not suitable to obtain the rate of increase in voltage (NO) may be excluded.

For example, in step S4, when the current rate of 20 C is set as the predetermined charging rate C0, it may be determined whether the current rate has continued for 0.1 seconds or longer. In step S5, it may be determined whether the amount of increase in voltage ΔV resulting from charging is larger than 0.1 V. When it is determined that the situation is not suitable (NO) in any one of these determination processes (S4, S5), the process may be returned to step S1 in which the charge current measured by the ammeter 102 is detected. When it is determined that the situation is suitable to obtain the rate of increase in voltage (YES) in any one of these determination processes (S4, S5), the process may proceed to the process of estimating the SOC.

Subsequently, the estimation unit 106 may estimate the state of charge of the lithium ion secondary battery 200 from the reference data stored in the second storage unit 105 on the basis of the changes in voltage, stored in the first storage unit 104 (S6). That is, the rate of increase in voltage is obtained on the basis of the changes in voltage, stored in the first storage unit 104. The state of charge of the lithium ion secondary battery 200 may be estimated from the rate of increase in voltage and the reference data stored in the second storage unit 105. After the process of estimating the state of charge of the lithium ion secondary battery 200 is executed, the process may be returned to step S1 in which the charge current measured by the ammeter 102 is detected. In the process of returning the process to step S1 in which the charge current measured by the ammeter 102 is detected, for example, an evaluation of the SOC may be corrected where necessary, for example, when the capacity of the lithium ion secondary battery 200 has degraded (S7). Whether the capacity of the lithium ion secondary battery 200 has degraded may be determined by referring to the result of another determination process in which the capacity degradation of the lithium ion secondary battery 200 is recorded.

As described above, even the lithium ion secondary battery that uses active material particles, such as the NiMn spinel, for the positive electrode active material also has a correlation between an open circuit voltage and a state of charge, for example, in a low state of charge where the SOC is lower than or equal to 50%. That is, in the low state of charge where the SOC is lower than or equal to 50%, it is possible to estimate the state of charge from the open circuit voltage. Therefore, in the above-described processing flow, a threshold may be provided in advance for the open circuit voltage that is measured by the voltmeter 103. When the open circuit voltage that is measured by the voltmeter 103 is lower than the threshold provided in advance, the state of charge may be estimated from the open circuit voltage. When the open circuit voltage that is measured by the voltmeter 103 is higher than the threshold provided in advance, the state of charge may be estimated by the state of charge estimation method according to the embodiment of the invention.

In this way, a determination processing unit that determines on the basis of the open circuit voltage measured by the voltmeter 103 whether the state of charge is estimated from the open circuit voltage or the state of charge is estimated by the state of charge estimation method according to the embodiment of the invention may be added to the above-described processing flow. For example, the determination processing unit may be added before step S1 of the processing flow of FIG. 9. Thus, in the low state of charge where the SOC is lower than or equal to 50%, it is possible to employ a simpler method of estimating the state of charge from the open circuit voltage. In this way, the state of charge may be estimated by using an appropriate state of charge estimation method as needed.

The state of charge estimation method and the state of charge estimation apparatus according to the embodiments of the invention are variously described. In the state of charge estimation method and the state of charge estimation apparatus according to the embodiments of the invention, as described above, the lithium ion secondary battery is charged at a current rate higher than or equal to the predetermined charging rate and the voltage of the lithium ion secondary battery is measured. The rate of increase in voltage is obtained from the voltages measured in the step of charging. In addition, the state of charge of the lithium ion secondary battery is estimated on the basis of the rate of increase in voltage and the reference data. The reference data include the correlation between the state of charge of the lithium ion secondary battery, which is the same type as the lithium ion secondary battery of which the state of charge is estimated, and the rate of increase in voltage in the case where the lithium ion secondary battery of the same type is charged at a current rate higher than or equal to the predetermined charging rate. The invention is not limited to the embodiments of the invention unless otherwise specified.

The state of charge estimation method according to the embodiment of the invention is able to accurately estimate the state of charge of the lithium ion secondary battery. Therefore, for example, the state of charge estimation method for a lithium ion secondary battery is suitably applied to a power source (driving power source) for a motor mounted on a vehicle. In this case, although the type of vehicle is not specifically limited, the vehicle includes, for example, a plug-in hybrid vehicle (PHV), a hybrid vehicle (HV), an electric vehicle (EV), an electric truck, a motorized bicycle, an electric power-assisted bicycle, an electric wheel chair and an electric train. The state of charge estimation method may be applied to the mode of a battery pack in which a plurality of lithium ion secondary batteries are connected in series or parallel with each other. The state of charge estimation method may also be utilized to estimate the state of charge of each individual one of the lithium ion secondary batteries of the battery pack.

What is claimed is:

1. A state of charge estimation method comprising:
measuring an increase rate of a voltage of a lithium ion secondary battery while charging the lithium ion secondary battery at a predetermined current rate, wherein the predetermined current rate allows lithium inside each particle of an electrode of the lithium ion secondary battery to be emitted from a surface of the particle at a rate higher than a rate at which the lithium migrates to the surface of the particle, and thereby allows the increase rate of the voltage of the lithium ion secondary battery to be governed by the rate at which the lithium migrates to the surface of the particle and is emitted outside the particle; and
estimating a state of charge of the lithium ion secondary battery based on the measured increase rate of the voltage, and a first reference data,
wherein the first reference data includes information about a correlation between a state of charge of a reference lithium ion secondary battery and a reference increase rate of a voltage of the reference lithium ion secondary battery when the reference lithium ion secondary battery is charged at the predetermined current rate.

2. The state of charge estimation method according to claim 1, wherein
the predetermined current rate is a current rate higher than or equal to 20 C.

3. The state of charge estimation method according to claim 1, wherein
the first reference data include pieces of reference data respectively corresponding to different current rates higher than or equal to the predetermined current rate.

4. The state of charge estimation method according to claim 1, wherein
the first reference data include pieces of reference data respectively corresponding to different temperatures of the reference lithium ion secondary battery.

5. The state of charge estimation method according to claim 1, wherein
the state of charge of the lithium ion secondary battery is estimated based on the first reference data and the increase rate of the voltage of the lithium ion secondary battery after a predetermined time from a start of charging the lithium ion secondary battery, and
the predetermined time corresponds to a time that is taken until the increase rate of the voltage of the lithium ion secondary battery decreases to a predetermined value or lower.

6. A state of charge estimation method comprising:
measuring an increase rate of a voltage of a lithium ion secondary battery while charging the lithium ion secondary battery at a predetermined current rate, wherein the predetermined current rate allows the increase rate of the voltage of the lithium ion secondary battery to be governed by a rate at which lithium (Li) inside each particle of an electrode of the lithium ion secondary battery migrates to a surface of the particle and is emitted outside the particle; and
estimating a state of charge of the lithium ion secondary battery based on the measured increase rate of the voltage and a first reference data, wherein
the first reference data includes information about a correlation between a state of charge of a reference lithium ion secondary battery and a reference increase rate of a voltage of the reference lithium ion secondary battery when the reference lithium ion secondary battery is charged at the predetermined current rate,
the state of charge of the lithium ion secondary battery is estimated based on the first reference data and the increase rate of the voltage of the lithium ion secondary battery after a predetermined time from a start of charging the lithium ion secondary battery,
the surface of the particle corresponds to a surface of each positive electrode active material particle in the lithium ion secondary battery, and
the predetermined time corresponds to a time that is taken until an electric charge migration reaction completes at the surface of each positive electrode active material particle in the lithium ion secondary battery.

7. The state of charge estimation method according to claim 1, wherein
the state of charge of the lithium ion secondary battery is estimated based on the first reference data and the increase rate of the voltage of the lithium ion secondary battery after a predetermined time from a start of charging the lithium ion secondary battery, and
the predetermined time is longer than or equal to 0.01 seconds and shorter than or equal to 0.2 seconds from the start of charging.

8. The state of charge estimation method according to claim 1, wherein
a positive electrode active material of the lithium ion secondary battery is formed of active material particles each having a spinel structure or an olivine structure.

9. The state of charge estimation method according to claim 1, wherein the lithium ion secondary battery of which the state of charge is estimated has a configuration equal to a configuration of the reference lithium ion secondary battery.

10. The state of charge estimation method according to claim 1, wherein
a previously acquired state of charge of the lithium ion secondary battery is corrected based on a reference state of charge in the first reference data, the reference state of charge corresponding to the measured increase rate of the voltage of the lithium ion secondary battery.

11. The state of charge estimation method according to claim 1, wherein
the surface of the particle is a surface of a positive electrode active material particle, and
the predetermined current rate is a current rate at which Li at the surface of the positive electrode active material particle decreases in the lithium ion secondary battery.

12. The state of charge estimation method according to claim 1, wherein
when an open circuit voltage of the lithium ion secondary battery is lower than a predetermined threshold of the open circuit voltage, the state of charge of the lithium ion secondary battery is estimated from the open circuit voltage based on second reference data indicating a correlation between an open circuit voltage and a state of charge of the reference lithium ion secondary battery, and
when the open circuit voltage of the lithium ion secondary battery is equal to or higher than the predetermined threshold of the open circuit voltage, the state of charge of the lithium ion secondary battery is estimated based on the first reference data.

13. A state of charge estimation apparatus comprising:
a charging device configured to charge a lithium ion secondary battery;
an ammeter configured to measure a charge current of the charging device;
a voltmeter configured to measure a voltage of the lithium ion secondary battery;
a first storage unit configured to store an increase rate of the measured voltage while the lithium ion secondary battery is charged at a predetermined current rate, wherein the predetermined current rate allows lithium inside each particle of an electrode of the lithium ion secondary battery to be emitted from a surface of the particle at a rate higher than a rate at which the lithium migrates to the surface of the particle, and thereby allows the increase rate of the measured voltage of the lithium ion secondary battery to be governed by the rate at which lithium (Li) inside each particle migrates to the surface of the particle and is emitted outside the particle;
a second storage unit in which a first reference data is stored; and
an estimation unit configured to estimate a state of charge of the lithium ion secondary battery based on the increase rate of the measured voltage of the lithium ion secondary battery and the first reference data, wherein
the first reference data indicates a correlation between the predetermined current rate and a corresponding change in voltage of a reference lithium ion secondary battery from a start of charging when the reference lithium ion secondary battery is charged at the predetermined current rate.

14. The state of charge estimation apparatus according to claim 13, wherein
multiple pieces of the first reference data respectively correspond to different current rates higher than or equal to the predetermined current rate, and
the estimation unit is configured to select one of the multiple pieces of the first reference data stored in the second storage unit in accordance with the increase rate of the measured voltage, and
the estimation unit is configured to estimate the state of charge of the lithium ion secondary battery based on the selected one of the multiple pieces of the first reference data.

15. The state of charge estimation apparatus according to claim 13, wherein
second reference data indicating a correlation between an open circuit voltage and a state of charge of the reference lithium ion secondary battery are further stored in the second storage unit, and
the estimation unit is configured to select the second reference data and estimate the state of charge from an open circuit voltage measured by the voltmeter when the open circuit voltage is lower than a predetermined threshold of the open circuit voltage.

16. The state of charge estimation apparatus according to claim 13, further comprising
a thermometer configured to measure a temperature of the lithium ion secondary battery, wherein
multiple pieces of third reference data respectively corresponding to different temperatures of the reference lithium ion secondary battery are stored in the second storage unit, and
the estimation unit is configured to select one of the multiple pieces of the third reference data in accordance with the measured temperature, and estimate the state of charge of the lithium ion secondary battery based on the selected one of the third reference data.

* * * * *